United States Patent [19]
Ferrell et al.

[11] Patent Number: 5,964,958
[45] Date of Patent: *Oct. 12, 1999

[54] METHODS FOR DRYING AND CLEANING OBJECTS USING AEROSOLS

[75] Inventors: Gary W. Ferrell, 608 Terrace Ave., Half Moon Bay, Calif. 94019; Thomas D. Spencer, Millbrae, Calif.

[73] Assignee: Gary W. Ferrell, Half Moon Bay, Calif.

[*] Notice: This patent is subject to a terminal disclaimer.

[21] Appl. No.: 08/984,413

[22] Filed: Dec. 3, 1997

Related U.S. Application Data

[63] Continuation of application No. 08/624,689, Mar. 25, 1996, abandoned, which is a continuation-in-part of application No. 08/616,165, Mar. 14, 1996, Pat. No. 5,685,086, which is a continuation-in-part of application No. 08/484,921, Jun. 7, 1995, Pat. No. 5,653,045.

[51] Int. Cl.$^6$ ........................................................ B08B 3/04
[52] U.S. Cl. ................................. 134/26; 134/21; 134/30; 134/31; 134/95.2; 134/95.3; 134/902; 34/340; 34/342; 34/401
[58] Field of Search ................................. 134/21, 26, 30, 134/31, 95.2, 95.3, 902; 34/340, 342, 401

[56] References Cited

U.S. PATENT DOCUMENTS

| | | | |
|---|---|---|---|
| 4,577,650 | 3/1986 | McConnell | 134/59 |
| 4,633,893 | 1/1987 | McConnell et al. | 134/95 |
| 4,738,272 | 4/1988 | McConnell | 134/59 |
| 4,740,249 | 4/1988 | McConnell | 134/25.4 |
| 4,778,532 | 10/1988 | McConnell et al. | 134/10 |
| 4,795,497 | 1/1989 | McConnell et al. | 134/18 |
| 4,813,851 | 3/1989 | Chun et al. | 417/54 |
| 4,856,544 | 8/1989 | McConnell | 134/95 |
| 4,899,767 | 2/1990 | McConnell et al. | 134/56 R |
| 4,911,761 | 3/1990 | McConnell et al. | 134/11 |
| 4,917,123 | 4/1990 | McConnell et al. | 134/95 |
| 4,984,597 | 1/1991 | McConnell et al. | 134/95 |
| 5,383,484 | 1/1995 | Thomas et al. | 134/184 |
| 5,520,744 | 5/1996 | Fujikawa et al. | 134/11 |
| 5,556,479 | 9/1996 | Bran | 134/1.3 |
| 5,653,045 | 8/1997 | Ferrell | 34/341 |
| 5,660,642 | 8/1997 | Britten | 134/30 |
| 5,685,086 | 11/1997 | Ferrell | 34/61 |
| 5,846,338 | 12/1998 | Bonora et al. | 734/11 |
| 5,882,433 | 3/1999 | Ueno | 134/31 |

OTHER PUBLICATIONS

Koppenbrink et al Particle Reduction on Silicon Wafers as a Result of Isopropyl Alcohol Vapor Displacement Drying After Wet Processing. Particles on Surfaces 2, pp. 235–242, 1989.

L.E. Scriven et al, "The Marangoni Effect", Nature, vol. 187 (Jul. 16, 1960) pp. 186–188.

*Primary Examiner*—Jill Warden
*Assistant Examiner*—S. Carrillo
*Attorney, Agent, or Firm*—John Schipper

[57] ABSTRACT

Methods for drying and cleaning objects that may have been wetted or contaminated in a manufacturing process. The objects are submerged in a rinse liquid in an enclosed chamber, and aerosol particles from a selected liquid are introduced into the chamber above the rinse liquid surface, forming a thin film on this surface. As the rinse liquid is slowly drained, some aerosol particles settle onto the exposed surfaces of the objects, and displace and remove rinse liquid residues from the exposed surfaces, possibly by a "chemical squeegeeing" effect. Surface contarminants are also removed by this process, which may be carried out at or near room temperature. Chamber pressure is maintained at or near the external environment pressure as the rinse liquid is drained from the chamber.

12 Claims, 4 Drawing Sheets

5,964,958

METHODS FOR DRYING AND CLEANING OBJECTS USING AEROSOLS

This patent application is a continuation of U.S. Ser. No. 08/624,689, filed Mar. 25, 1996, now abandoned, which is a continuation in part of U.S. Ser. No. 08/616,165, filed Mar. 14, 1996, now U.S. Pat. No. 5,685,086, which is a continuation in part of U.S. Ser. No. 08/484,921, filed Jun. 7, 1995, now U.S. Pat. No. 5,653,045.

FIELD OF THE INVENTION

This invention relates to drying and cleaning of manufactured objects, including electronic components, using aerosols created by sonic or ultrasonic means.

BACKGROUND OF THE INVENTION

Objects that are being manufactured using processes involving application of liquids and other fluids often require that the parts be thoroughly dried before the manufacturing process can continue. For example, in fabrication of integrated circuits, doping, photomasking, etching and passivation processes often require application of particular liquids at one stage and removal of liquid residues before the next stage proceeds. Drying and removal of these liquid residues must be complete, but the drying process should, ideally, occur in a relatively short time interval and with expenditure of a minimum of energy and chemicals to implement the drying process.

Several workers have disclosed methods for drying parts, including integrated circuits, by use of heated or superheated gases. McConnell et al, in U.S. Pat. No. 4,577,650, No. 4,633,983, No. 4,738,272, No. 4,778,532, No. 4,856,844, No. 4,899,767, No. 4,911,761, No. 4,917,123 and No. 4,984,597, disclose methods of drying semiconductor wafers by flowing a heated vapor or fluid past the wafers to be dried in a vessel, as part of a wafer processing sequence. The preferred drying vapor is superheated isopropanol, which forms a minimum boiling azeotrope with water and is believed to displace water from the wafer surfaces, and the vapor flows into the vessel at one end and simultaneously flows out of the vessel at another end.

In U.S. Pat. No. 5,383,484, Thomas et al disclose use of a plurality of megasonic beam transducers, located at staggered positions, for cleaning wafers. Each transducer emits a vibratory megasonic beam with an unspecified (very high) frequency in a fixed direction, and the transducer locations are chosen so that the collection of beams irradiate, and thereby clean, all wafer surfaces in a chamber, no matter how the wafers are arranged.

Use of ultrasonic transducers in a chemical cleaning bath to cooperatively remove contaminants and unwanted material layers from semiconductor wafers, medical instruments and other objects of interest is disclosed by Erickson et al in U.S. Pat. No. 5,178,173, by Watanabe et al in U.S. Pat. No. 5,203,798, by Tamaki et al in U.S. Pat. No. 5,227,001, by Evans et al in U.S. Pat. No. 5,248,456, by Smith et al in U.S. Pat. No. 5,337,446, by Koretsky et al in U.S. Pat. No. 5,368,054, by Steinhauser et al in U.S. Pat. No. 5,380,369, by Shibano in U.S. Pat. No. 5,447,171, by Awad in U.S. Pat. No. 5,464,477, by Kato in U.S. Pat. No. 5,467,791, by Thjietje in U.S. Pat. No. 5,468,302 and by Campbell in U.S. Pat. No. 5,472,005.

Use of ultrasonic transducers to coat, spray, deposit or otherwise apply a desired material to an object surface is disclosed by Bachmann in U.S. Pat. No. 5,387,444, by Erickson et al in U.S. Pat. No. 5,409,163, and by Versteeg et al in U.S. Pat. No. 5,451,260. An ultrasonic fogging device is disclosed by Munk in U.S. Pat. No. 5,454,518.

These approaches heated or superheated gases or direct beam irradiation to dry an object surface; or they use cooperative action by an ultrasonic beam and an active chemical bath to remove contaminants from, or to apply a desired material to, an object surface. These approaches are complex, usually require operation at high temperatures, often require processing times of several minutes, and often require use of specially resistant chamber walls for the processing chamber.

What is needed is a method and associated apparatus for drying and cleaning objects in a manufacturing process that works well at room temperature and is simple, that is demonstrably complete, with no significant residues, that can be accomplished in times as short as one minute, that can be performed in a chamber with chamber walls made of almost any material, and that requires use of only a very small amount of a drying agent, with minimal expenditure of energy, particularly thermal energy. Preferably, the process should be performable over a wide range of temperatures, and should be easily scalable to any size surface.

SUMMARY OF THE INVENTION

The needs are met by the invention, which provides a method and associated apparatus for drying objects by use of recyclable water and a small amount of a low surface tension liquid plus (optionally) brief application of a recyclable cleaning agent. In one embodiment, the objects to be dried are submerged in a rinse liquid, such as water, in a chamber. The rinse liquid surface is covered with a very thin film of a low surface tension selected liquid, such as isopropyl alcohol ("IPA"), formed from an aerosol created by sonic or ultrasonic vibrations of a small stream of the selected liquid. Other suitable liquids include ethyl alcohol, methyl alcohol, tetrahydrofuran, acetone, perfluorohexane, hexane and ether. The thin film is continually replenished as needed, and the rinse liquid covering the objects to be dried is slowly drained. As the rinse liquid and thin film drain, the selected liquid briefly contacts the surfaces of the objects and removes water residues by a "chemical squeegeeing" process that is discussed later. Optionally, the objects can be subjected to an additional chamber purge or drying process, using a heated or ambient temperature cleaning fluid, such as dry $N_2CO$ or $CO_2$ gas, after the chamber has been drained. Optionally, chamber pressure is maintained near or above the external environment pressure as the rinse liquid is drained from the chamber.

Process parameters that can be varied to control the process include vibration frequency for creation of aerosol particles from the selected liquid, a representative aerosol particle diameter, delivery rate for the selected liquid, pressure and temperature at which the selected liquid is delivered for creation of the aerosol particles, temperature of the drying fluid used (if any), and choice of the selected liquid and of the drying fluid used (if any).

The invention requires as little as 1–milliliters (ml) of the selected liquid to dry objects in a chamber with volume of 10–20 liters, or smaller or larger, if desired. This approach provides several benefits. First, the process is carried out at or near room temperature, with little energy expenditure, and does not require use of heated or superheated liquids or gases for drying. Second, the process uses a very small amount of the selected liquid in a large volume of rinse liquid (10–20 liters) so that the mixture of rinse liquid and selected liquid can normally be disposed of without the special handling procedures required for hazardous materials. Third, a wide variety of inexpensive selected liquids can be used. Fourth, use of a covering film of selected liquid minimizes vapor from the rinse liquid remaining in the chamber after drainage. Fifth, the process is easily scaled up or down, with no substantial changes in the apparatus. Sixth, the process removes large diameter contaminants that are not chemically bound to an object surface.

DESCRIPTION OF BEST MODES OF THE INVENTION

Figure 1:
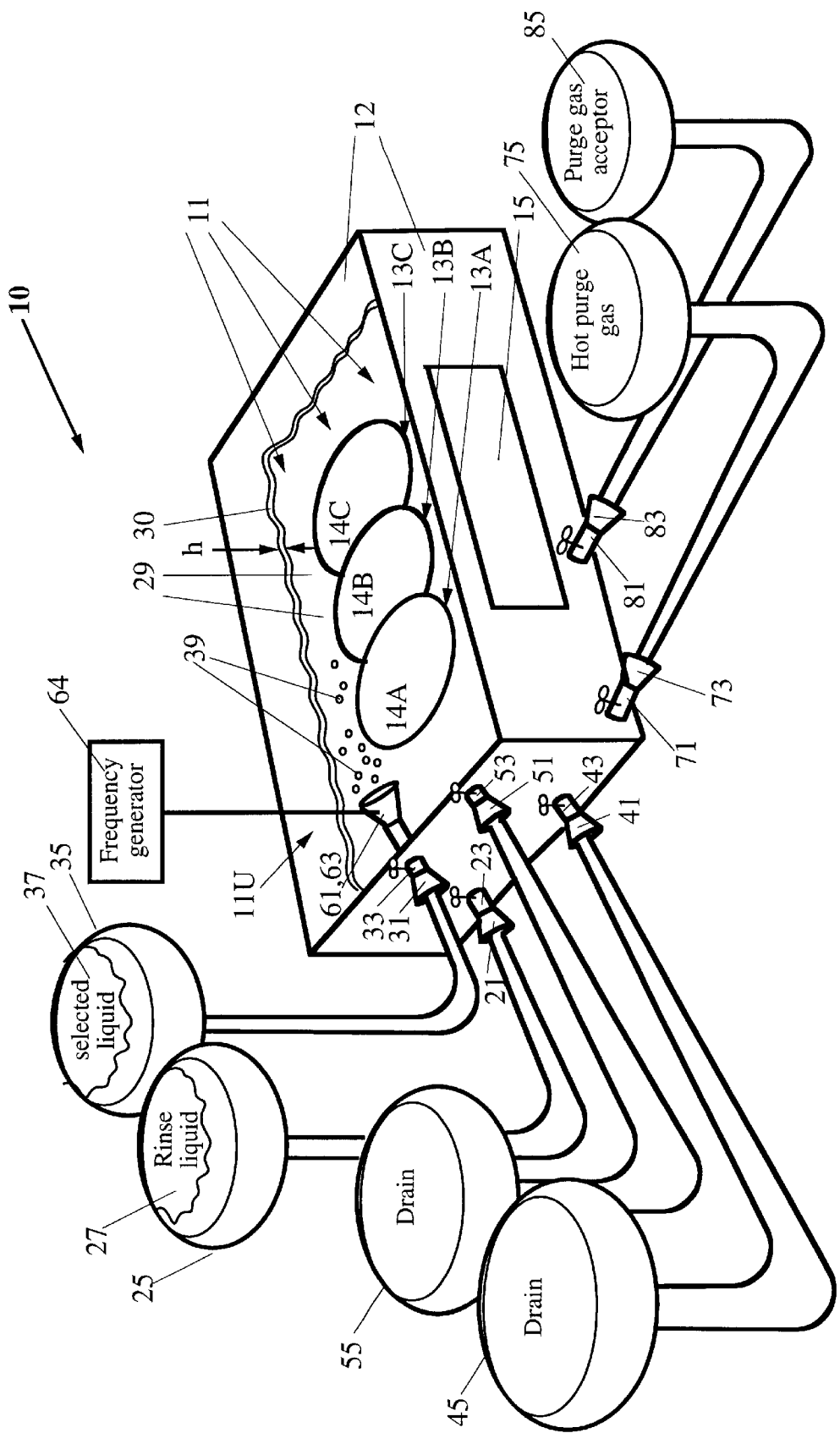
FIG. 1 illustrates suitable apparatus, in one embodiment, for practising the invention, with the objects submerged in a rinse liquid in a chamber.

FIG. 1 illustrates one embodiment of apparatus 10 that is useful for practising the invention. An enclosed chamber 11 is defined by a housing 12 and is provided with a rack (optional) for holding the objects 13A, 13B, 13C, etc. to be dried. The objects 13A, 13B, 13C are placed into, and removed from, the chamber 11 through a slidable, hinged or other operable entryway 15 that is part of the housing 12. When the entryway 15 is closed or engaged, the chamber is enclosed, preferably in an gas-tight manner, and any remaining gas in the chamber can optionally be removed. A first port 21 and associated first valve 23 are attached to the housing 12 and are connected to a source 25 of water or other suitable rinse liquid 27 in which the objects 13A, 13B, 13C are initially submerged. A second port 31 and associated second valve 33 are attached to the housing 12 and are connected to a selected liquid source 35, such as a pressurized tank maintained at a pressure of 5–50 psi, of a selected drying liquid or fluid 37 ("selected liquid") that will primarily dry the objects 13A, 13B, 13C.

A third port 41 and associated third valve 43, which may coincide with the first port 21 and first valve 23, are attached to the housing 12 and are connected to a first liquid or fluid tank or other suitable first drain acceptor 45 that receives and drains the rinse liquid 27 and absorbed selected liquid 37 from the chamber 11. A fourth port 51 and associated fourth valve 53, which may coincide with the second port 31 and second valve 33, are attached to the housing 12 and are connected to a second liquid or fluid tank or other suitable second drain means 55 that receives and drains the selected liquid 37, and aerosol droplets 39 from the selected liquid, from the chamber 11.

Initially, the objects 13A, 13B, 13C are placed in the chamber 11 in a rack or cassette (not shown), the entryway 15 is closed or engaged, the chamber is evacuated, and rinse liquid 27 is admitted to the chamber through the first port 21 and first valve 23 so that the objects are fully submerged in the rinse liquid. The first valve 23 is then closed. Alternatively, the objects 13A, 13B, 13C may be partly submerged in the rinse liquid 27 so that a portion of the surfaces of these objects are exposed above the exposed surface of the rinse liquid.

A small stream of the selected liquid 37 then passes through the second port 31 and second valve 33 and is received by a piezoelectrically driven head 61 and vibrating sonic or ultrasonic nozzle 63 that vibrates at a selected frequency f lying in the range 10 kHz$\leq$f$\leq$1000 kHz, and more preferably in the narrower range 20 kHz$\leq$f$\leq$100 kHz. The driven head 61 is connected to and driven by a frequency generator 64 that is preferably located outside the chamber 11 and that permits selection of a vibration frequency f in the indicated range. When the selected liquid 37 is present in the vibrating nozzle 63 and the nozzle is vibrating, the selected liquid is converted into a plurality of aerosol droplets 39 that move into the chamber 11 and occupy most or all of an upper portion 11U of the chamber that is not already filled by the rinse liquid 27 and submerged objects 13A, 13B, 13C.

Figure 2A:
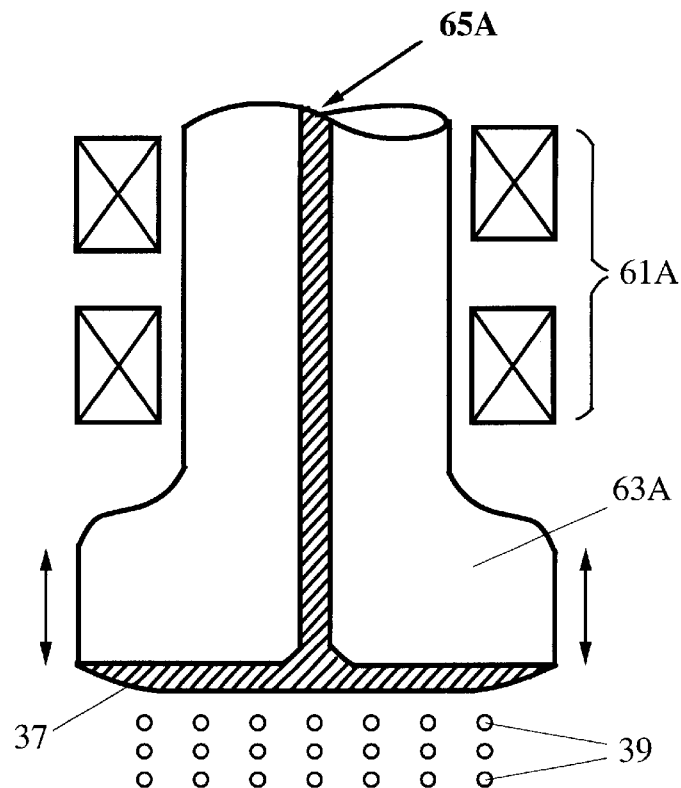
FIGS. 2A and 2B are schematic views of aerosol creating vibrating nozzles suitable for use with the invention.

FIG. 2A illustrates a suitable drive head 61A and vibrating nozzle 63A that can be used with the apparatus shown in FIG. 1. The vibrating nozzle 63A preferably has a hollow column 65A formed therein with diameter d(col)$\approx$200 $\mu$m, through which the selected liquid 37 (cross-hatched) flows. The vibrating nozzle then "shakes off" small droplets 39 of selected liquid 37, which form aerosol droplets in a roughly cylindrical pattern and move into the portion of the chamber 11 above the rinse liquid.

Figure 2B:
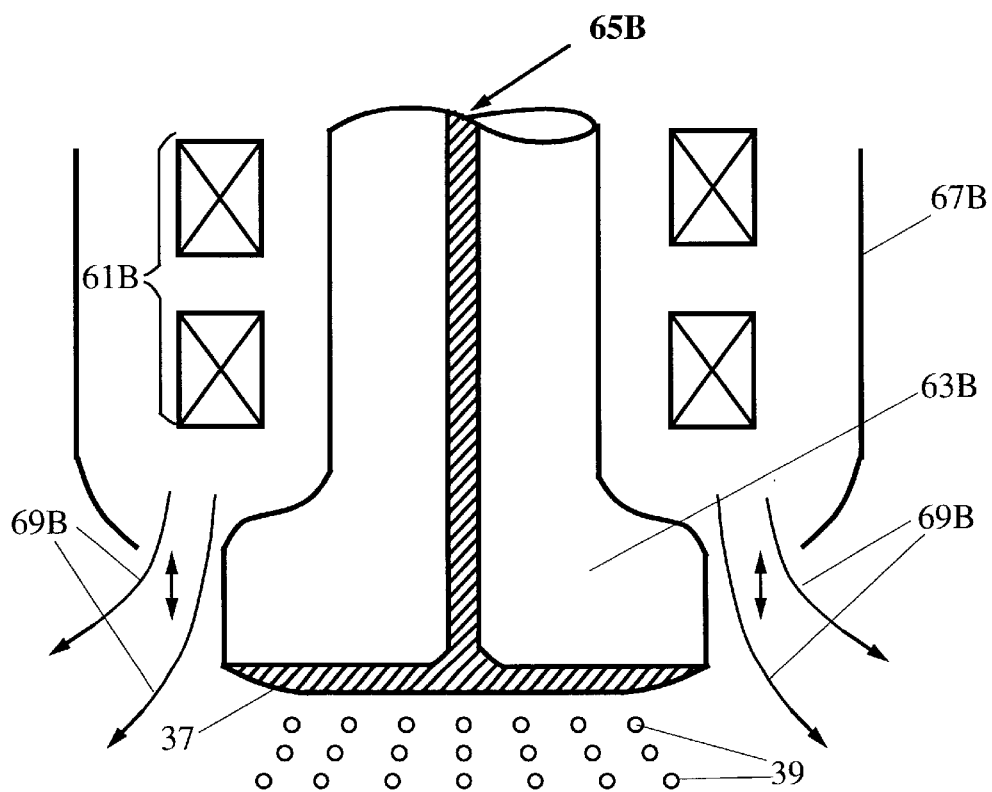

FIG. 2B illustrates another suitable drive head 61B and vibrating nozzle 63B, including a thin hollow column 65B therein through which the selected liquid 37 flows. A housing 67B surrounds the nozzle 63B and directs a ring of hot or cold inert gas 69B toward the aerosol droplets 39, which move into the chamber in a conical or other desired pattern for enhanced distribution of the aerosol droplets throughout the chamber. Many other drive head/vibrating nozzle combinations can also be used here.

I have found that use of a higher frequency f will tend to produce aerosol droplets 39 with a smaller mean diameter d(mean). For a vibration frequency f in the range 20 kHz$\leq$f$\leq$100 kHz, I estimate that the mean aerosol droplet diameter lies in the range 10 $\mu$m$\leq$d(mean)$\leq$50 $\mu$m. The mean droplet diameter can be varied by varying the diameter (s) d(mem) of the membrane apertures 66 and by varying the frequency f of vibration of the vibrating nozzle 63A or 63B.

The selected liquid 37 should be non-reactive with the objects 13A, 13B, 13C and with the walls of the chamber 11 and should have a substantially lower surface tension than the surface tension of the rinse liquid. Suitable selected liquids include isopropyl alcohol, ethyl alcohol, methyl alcohol, tetrahydrofuran, acetone, perfluorohexane, hexane and ether, as well as many other low surface tension liquids and fluids. Use of any of these substances as a selected liquid does not require provision of chamber walls made of specially-resistant materials.

The selected liquid 37 may be held in the selected liquid source 35 at a pressure of 5–50 psi above atmospheric pressure to facilitate delivery and to suppress the slight volatilization of the selected liquid that might otherwise naturally occur. The preferred rinse liquid, de-ionized water, has a surface tension $\sigma$=73 dynes/cm at T$\approx$20° C., and organic molecules such as methyl alcohol, ethyl alcohol, isopropyl alcohol, n-hexane and ether have surface tensions $\sigma$ in the range 17 dynes/cm$\leq$$\sigma$$\leq$23 dynes/cm at T=20° C. so that $\sigma$(selected liquid)<<$\sigma$(rinse liquid) at room temperature.

Use of the selected liquid 37 at or near room temperature is preferred here. Use of the selected liquid 37 at a substantially elevated temperature can reduce the surface tension of the rinse liquid 27, relative to the surface tension of the selected liquid 37, and thus interfere with the chemical squeegee effect relied upon for this process.

An aerosol particle is a cluster or collection of molecules of the selected liquid 37 that has not undergone a phase transformation into a vapor form. Thus, the energy E(aerosol) (1.6 Watts for a typical sonic head, or less than 100 Joules/gm at a flow rate of 2 ml/min) required to convert one gram of the selected liquid 37 into aerosol droplets 39, provided by the vibrating nozzle, is much less than the energy of vaporization E(vapor) required to heat and convert one gram of the selected liquid 37 into its vapor form. We estimate that the ratio E(aerosol)/E(vapor) is less than 2 percent. Production of the aerosol particles can be carried out at or near room temperature, and use of a very high temperature, such as T=60–200° C., is neither needed nor advisable for this process. Further, only a small amount of the selected liquid 37, as low as 1–5 ml, is required for drying several objects 13A, 13B, 13C in the chamber 11.

The aerosol droplets 39 move into the chamber 11, and many of these droplets settle onto an exposed surface 29 (preferably calm) of the rinse liquid 27 as a thin film 30 having a varying thickness h(aerosol). An estimated time required to form this thin film 30 is 40–60 sec. A portion of the aerosol droplets 39 that join the film 30 will diffuse into the rinse liquid 27 so that, if this film is not replenished with additional aerosol droplets, the film 30 will quickly and substantially disappear. Preferably, the volume flow rate r(sel) of the selected liquid 37 to the vibrating nozzle 63 is adjusted so that the rate at which aerosol droplets 39 join the film 30 is sufficient to maintain or increase a selected thickness h(aerosol) for the film. A preferred range for the film thickness h(aerosol) is 0.5 mm≦h(aerosol)≦5 mm, but this thickness may be made larger by increasing the volume flow rate r(sel). For a chamber 11 having an exposed (upper) surface for the rinse liquid 27 with an area of about 900 $cm^2$, a volume flow rate r(sel)=r2=1–5 ml per minute of the selected liquid 37 suffices. Usually, a volume flow rate r2=1–2 ml/min is high enough. The time required to drain the chamber at a drain rate of 5 mm/sec is about 20–40 sec for a semiconductor wafer 10–20 cm in diameter. Thus, very little of the selected liquid 37 is absorbed or diffuses into the rinse liquid 27 in the course of the time interval (60–100 sec) required for establishment of the film and draining of the chamber.

Because so little of the selected liquid 37 is used in the process, the selected liquid source 35 may have a relatively small volume, as little as 20–25 ml, and the selected liquid source 35 may be located at a considerable distance, such as 1–4 meters, from the chamber 11. This enhances the safety of the process, where a selected liquid is used that has a low flash point or that can initiate an explosion.

A very small amount of the selected liquid 37 will vaporize naturally at the process temperature, preferably room temperature, based on the equilibrium vapor pressure coefficient of the selected liquid at that temperature. This vaporized portion should be relatively small in the enclosed chamber 11 at room temperature, and the vapor portion of the selected liquid 37 will quickly come to equilibrium with the liquid film and aerosol portions of the selected liquid 37. Use of a process temperature much higher than room temperature would produce a selected liquid 37 with a moderately higher equilibrium vapor pressure coefficient and a comcomitantly higher amount of vapor from the selected liquid. This natural vaporization of a small part of the selected liquid 37 is not regarded as a useful part of the drying process.

After a film 30 of the aerosol droplets is established on the surface 29 of the rinse liquid 27, which may require 40–60 sec, the rinse liquid 27 is slowly drained from the chamber 11 through the third port 41 and third valve 43 into the drain tank 45. Draining of the rinse liquid 27 will require an estimated 20–40 sec for a chamber holding 10–20 liters of the rinse liquid 27. A preferred range for the drain rate r(drain) is 3–10 mm/sec decrease in the height of the rinse liquid 27 in the chamber 11, and r(drain)=5 mm/sec is a suitable drain rate for this process. Draining occurs slowly in order to preserve the thin film 30 of the selected liquid 37 at the otherwise-exposed surface 29 of the rinse liquid. As draining of the rinse liquid 27 proceeds, aerosol droplets 39 continue to be produced by flow of a small stream of the selected liquid 37 through the vibrating nozzle 63. The volume flow rate r(sel) of the selected liquid 37 may be adjusted toward higher or lowers values as draining of the rinse liquid 27 (and absorbed aerosol particles 39) proceeds.

As the rinse liquid 27 drains from the chamber 11, the surfaces 14A, 14B, 14C of the objects 13A, 13B, 13C are increasingly exposed above the exposed rinse liquid surface 29 and overlying film 30, and aerosol droplets 39 in the upper part of the chamber 11U settle onto these exposed surfaces 14A, 14B, 14C, as shown in FIG. 3. Also, a portion of the film 30 of the selected liquid 37 may settle on the exposed portions of the object surfaces 14A, 14B, 14C, rather than moving with the rinse liquid 27 toward the third port 41. The selected liquid 37 is chosen to have a much smaller surface tension σ(sel) than the surface tension σ(rinse) of the rinse liquid 27. If the rinse liquid 27 is water, the associated surface tension is σ(rinse)=73 dynes/cm at room temperature. In this instance, the selected liquid 37 may be isopropyl alcohol ("IPA") or ethyl alcohol or methyl alcohol, with the respective surface tensions of σ=21.7 dynes/cm, 22.6 dynes/cm, and 22.8 dynes/cm at room temperature. The selected liquid 37 is also chosen for its ability to displace rinse liquid at whatever process temperature is used. Room temperature (T=20° C.), and even lower temperatures, can be used here. The process also works satisfactorily at somewhat higher temperatures.

As exposed portions of the object surfaces 14A, 14B, 14C receive the aerosol droplets 39 of the selected liquid 37, new films 16A, 16B, 16C of the aerosol droplets 39 or selected liquid 37 form on these exposed portions. As draining of the rinse liquid 27 from the chamber 11 proceeds, and after draining is completed, the selected liquid 37 in the films 16A, 16B, 16C displaces most or all of the rinse liquid 27 that remains on the exposed portions of the object surfaces 14A, 14B, 14C, in large part because the surface tension σ(sel) of the selected liquid 37 is much smaller than the surface tension σ(rinse) of the rinse liquid 27. The rinse liquid 27 that is displaced by the selected liquid runs down the exposed surfaces 14A, 14B, 14C of the objects 13A, 13B, 13C and is drained away with the bulk of the rinse liquid in the chamber. The selected liquid 37 that forms a film on the surfaces 14A, 14B, 14C of the objects 13A, 13B, 13C also runs down these surfaces and is drained away with the bulk of the rinse liquid 27. The films 16A, 16B, 16C of selected liquid 37 thus act as "chemical squeegees" in removing rinse liquid 27 and selected liquid 37 from the exposed surfaces 14A, 14B, 14C of the objects 13A, 13B, 13C.

This chemical squeegeeing of the objects' exposed surfaces 14A, 14B, 14C has another benefit. The process not only dries the objects' surfaces but also removes most of the larger contaminant particles from these surfaces, if these contaminant particles are not chemically bound to the host surfaces. I have examined some bare silicon surfaces before the chemical squeegeeing process is applied and have found a substantial number of contaminant particles with diameter at least 0.3 μm on these surfaces, as indicated in column (2) of Table 1. I have then applied the chemical squeegeeing process, have re-examined the same surfaces after completion of the chemical squeegeeing process, and have found the number of contaminant particles is reduced after completion of the chemical squeegeeing process, as shown in column (3) of Table 1. These results indicate that chemical squeegeeing alone removes 12–100 percent of the contaminant particles with diameters greater than 0.3 μm, depending on size.

TABLE 1

Chemical Squeegee Removal of Large Contaminant Particles

| Particle Size | Particles before Chem. Squeegee | Particles after Chem Squeegee |
| --- | --- | --- |
| 0.329–0.517 μm | 8 | 7 |
| 0.518–0.810 | 7 | 2 |
| 0.811–1.270 | 7 | 2 |
| 1.271–1.990 | 3 | 1 |
| 1.991–3.130 | 6 | 1 |
| 3.131–4.910 | 6 | 0 |

At about the time the rinse liquid 27 becomes fully drained from the chamber 11 and the surfaces 14A, 14B, 14C of the objects 13A, 13B, 13C are fully exposed, the second port 31 and second valve 33 are closed, the vibrating nozzle 63 is shut down, and the fourth port 51 and fourth valve 53 are opened. The remaining selected liquid 37, aerosol droplets 39, rinse liquid 27, and any vapor from the rinse liquid and selected liquid are then removed from the chamber 11 through the fourth port 51. This portion of the process may require another 10–20 sec. but may be continued for a longer time interval, if desired, to completely remove the remaining selected liquid 37 and any remaining rinse liquid 27 from the films 16A, 16B, 16C and from the chamber 11. Drying of the objects 13A, 13B, 13C is now substantially complete.

Optionally, hot or room temperature dry nitrogen N2, carbon monoxide CO, carbon dioxide $CO_2$ or other inert gas may be admitted into the chamber 11 through a fifth port 71 and associated fifth valve 73 to purge the chamber 11 and/or clean any remaining substances from the exposed surfaces 14A, 14B, 14C of the objects 13A, 13B, 13C. The hot purge gas is received by the chamber 11 from a purge gas tank 75 and is removed through a sixth port 81 and associated sixth valve 83 that may coincide with the fifth port 71 and fifth valve 73, respectively. The hot purge gas is received from the chamber 11 in a spent purge gas tank 85 for recycling, processing or disposal. This portion of the process, if included, may require another 30–60 sec.

Figure 3:
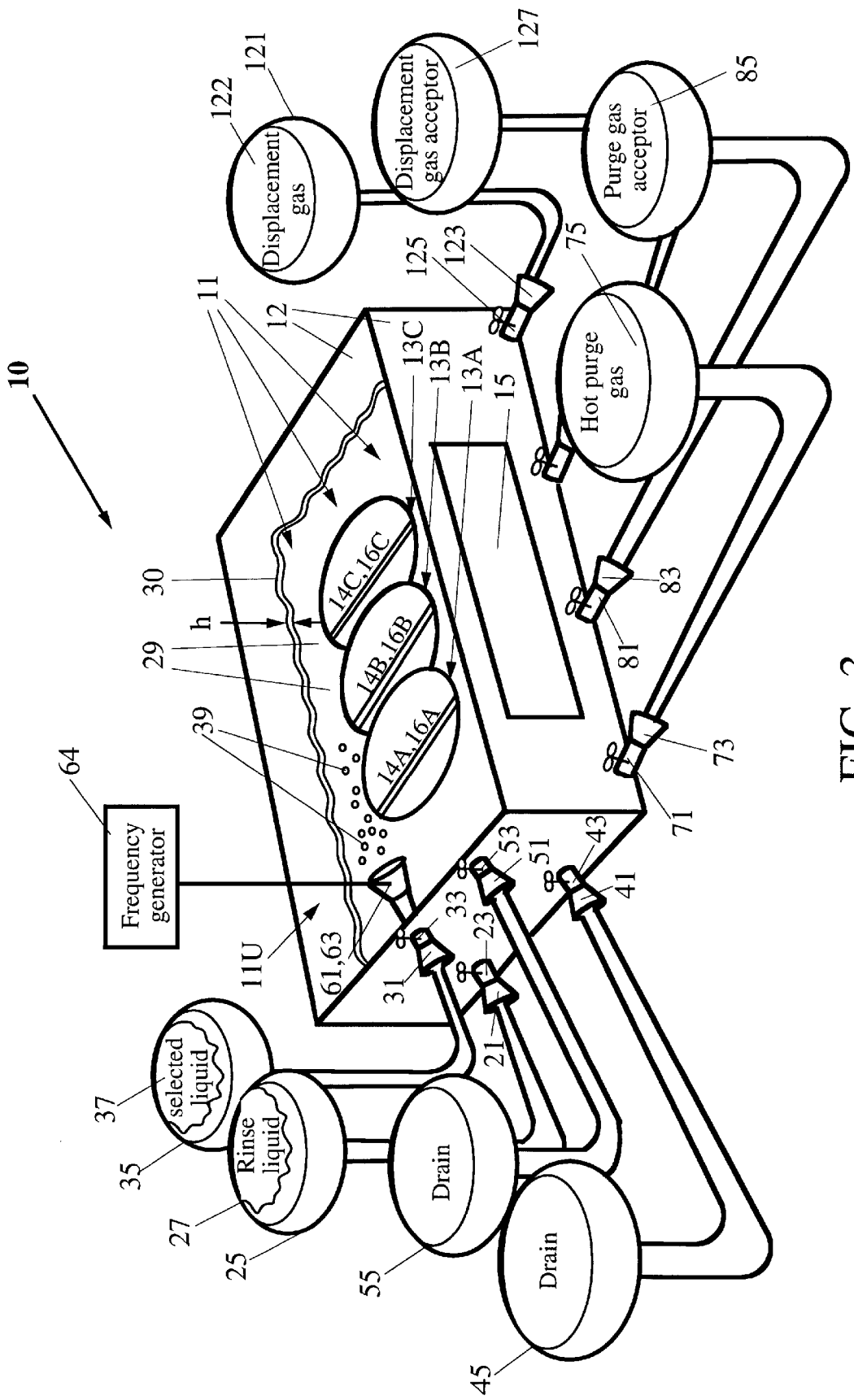
FIG. 3 illustrates the apparatus of FIG. 1 with the rinse liquid partly drained from the chamber.
Figure 4:
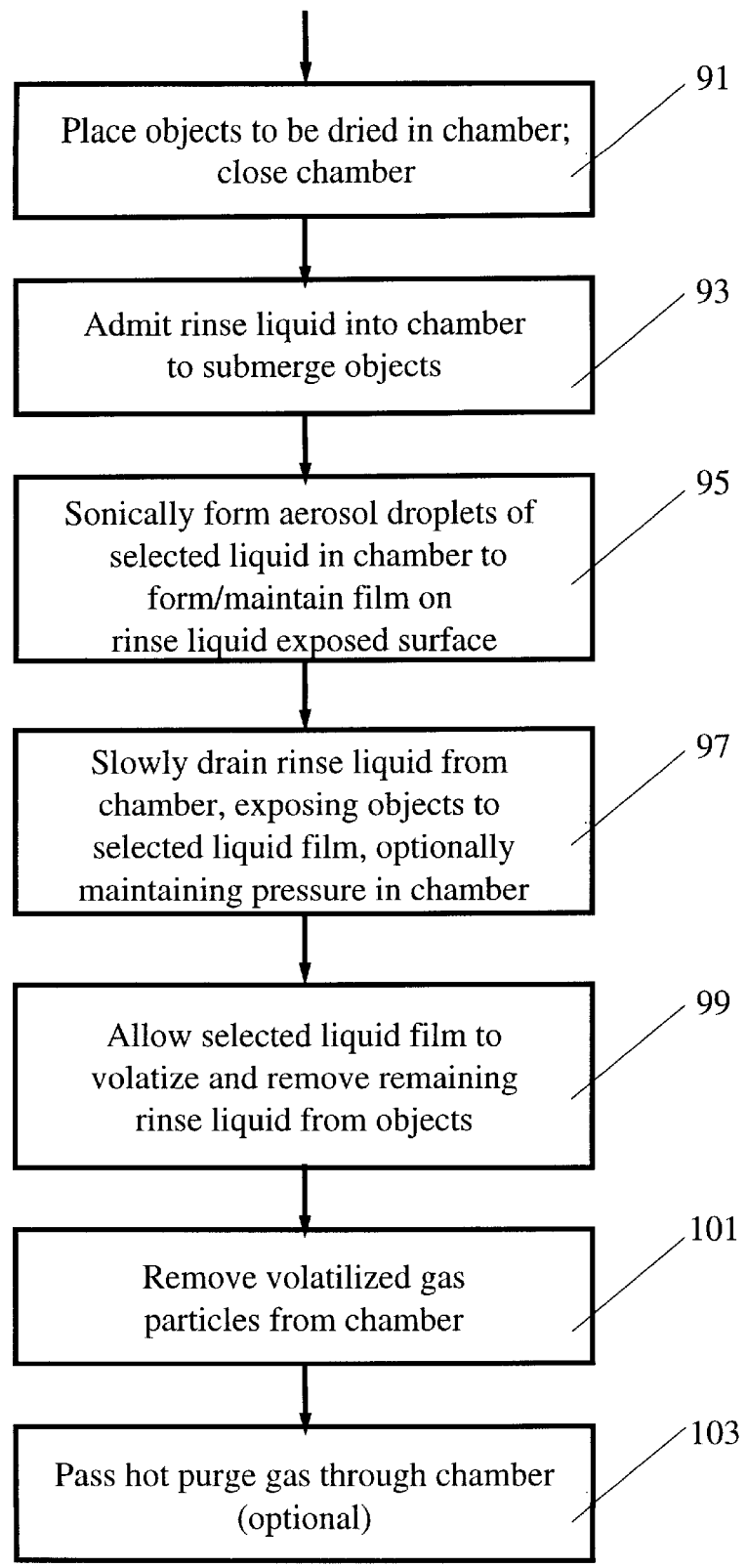
FIG. 4 is a flow chart of one embodiment of the method.

FIG. 4 is a flow chart indicating the process steps to be taken in one embodiment of the invention. In step 91, the objects 13A, 13B, 13C (FIGS. 1 and 3) to be dried and/or cleaned are placed into the chamber, and the chamber is closed. In step 93, rinse liquid 27 is admitted into the chamber to partially or (preferably) fully submerge the objects. In step 95, aerosol droplets of the selected liquid 37 are formed within the chamber, and a film of the selected liquid is formed and maintained on the exposed surface of the rinse liquid. In step 97, the rinse liquid 27 and any absorbed selected liquid 37 are slowly drained from the chamber, to ultimately expose the surfaces of the objects to the aerosol droplets and to allow films of the selected liquid to form on the objects surfaces; optionally, the chamber pressure is maintained near or above the external environment pressure. In step 99, the films of selected liquid on the objects' surfaces perform chemically squeegeeing to remove any remaining rinse liquid 27 and remaining selected liquid 37 and contaminants from the objects' surfaces. In step 101 (optional), any remaining selected liquid 37 and rinse liquid 27 are removed from the chamber. In step 103 (optional), a purge gas is passed through the chamber to remove any remaining gas and/or liquid particles from the chamber. The objects, now dried and/or cleaned, can be removed from the chamber or may be further processed in the chamber.

No matter what drain rate r1 is selected, removal of the rinse liquid 27 from the chamber 11 will produce a vacuum within the chamber that is not fully relieved by receipt within the chamber of the small amount of selected liquid from the drive head 61 and vibrating nozzle 63. If the chamber 11 is sufficiently air-tight, little or no gas from the external environment will enter the chamber in response to creation of this vacuum. However, many chambers are not sufficiently air-tight; and in such instances an appreciable amount of gas from the external environment, possibly bringing with this gas one or more contaminant particles that may settle on the exposed surfaces 14A, 14B, 14C of the selected objects 13A, 13B, 13C. This has been observed in some, but not all, of the tests of the procedure and apparatus disclosed here.

With reference to FIG. 3, a reservoir 121 of a substantially inert displacement gas 122, such as $N_2$, CO or $CO_2$, is optionally provided and is in fluid communication with the chamber 11. The inert gas 122 in the reservoir 121 passes through a port 123 and an associated valve and pressure control device 125 to enter the chamber 11. The valve and pressure control device 125 senses the increasing (negative) pressure that is created within the chamber 11 as the rinse liquid 27 is drained from the chamber using the port and valve 41 and 43. In response to this increasing (negative) pressure, the valve and pressure control device 125 allows sufficient inert gas 122 from the inert gas reservoir 121 to enter the chamber so that the chamber pressure is maintained at a pressure p≈p(external), where p(external) is approximately equal to the local pressure external to the chamber, or at a higher pressure. A chamber pressure p that is somewhat higher than the local external pressure p(external) is preferred here so that some of the inert gas 122 will tend to move out of the chamber 11 into the external environment and will discourage in-flow of gases from the external environment, if the chamber is 2 0 not sufficiently air-tight. Optionally, the pressure p maintained within the chamber 11 may be somewhat less than p(external), perhaps as low as 0.8p(external), and still discourage entry of gas from the external environment into the chamber. After the rinse liquid 27 is fully drained from the chamber 11 and the surfaces 14A, 14B and 14C of the selected objects 13A, 13B, 13C are fully dried and/or cleaned, the inert gas 122 may be removed from the chamber to an inert gas reservoir 127 before the next step is taken in processing the selected objects.

Alternatively, if the drain rate r1 for the rinse liquid 27 from the chamber 11 is controlled sufficiently well, the valve and pressure control device 125 need not sense the internal pressure of the chamber 11. In this approach, the valve and pressure control device 125 admits insert gas 122 at a programmed volume flow rate r3 from the inert gas reservoir 121, where the rate r3 is sufficient to maintain the internal pressure p≈p(external) or higher within the chamber 11 as the rinse liquid 27 drains from the chamber.

The temperature T of the inert gas 122 is preferably at or near the temperature of the rinse liquid, which is usually room temperature or somewhat colder or somewhat warmer. The purge gas reservoir 75 may also serve as the inert gas reservoir 121, with inclusion of the valve and pressure control device 125.

We claim:

1. A method for removing at least one contaminant particle having diameter of at least 0.3 μm from at least one exposed surface of an object, the method comprising the steps of:

placing a selected object to be cleaned in an enclosed chamber;

admitting a sufficient amount of a rinse liquid having a selected surface tension into the enclosed chamber so that the selected object is partly or fully submerged in the rinse liquid;

admitting into the enclosed chamber, at a volume flow rate r2 lying in a first selected volume flow range, a selected liquid that has a surface tension that is substantially lower than the surface tension of the rinse liquid;

forming aerosol droplets of the selected liquid within the enclosed chamber;

allowing a portion of the aerosol droplets to form a film of the selected liquid on an exposed surface of the rinse liquid;

draining the rinse liquid from the enclosed chamber at a volume flow rate r1 lying in a second selected volume flow range, and allowing the film of the selected liquid to form on exposed surfaces of the selected object; and allowing the film of selected liquid to displace the rinse liquid on the exposed surfaces of the selected object and to thereby remove said at least one contaminant particle having a diameter of at least 0.3 μm from said at least one exposed surface of the selected object.

2. The method of claim 1, further comprising the step of choosing said selected liquid to be chemically substantially unreactive with said selected object.

3. The method of claim 1, further comprising the step of selecting said rate r1 so that the depth of said rinse liquid in said enclosed chamber decreases at a rate of between 3 mm/sec and 10 mm/sec.

4. The method of claim 1, further comprising the step of selecting said rate r2 to lie in said first selected volume flow range 1 ml/min$\leq$r2$\leq$5 ml/min.

5. The method of claim 1, further comprising the step of forming substantially all of said aerosol particles within said enclosed chamber without a change in a vapor phase of said selected liquid.

6. The method of claim 1, further comprising the step of forming said aerosol particles within said encloned chamber with an energy expenditure of 1.6 Watts.

7. The method of claim 1, further comprising the steps of:

providing a measure of a pressure of an environment that is external to said enclosed chamber;

admitting a selected displacement gas into said enclosed chamber at the time said rinse liquid is being drained from said enclosed chamber; and controlling a rate of admission of the selected displacement gas into said enclosed chamber so that total gas pressure within said enclosed chamber is at or above the external environment pressure while said rinse liquid is being drained from said enclosed chamber.

8. The method of claim 1, further comprising the step of performing, at a temperature that is approximately room temperature, at least one of said steps of forming said aerosol particles, allowing said portion of said aerosol particles to form said film of said selected liquid, draining said rinse liquid from said enclosed chamber, allowing said film of said selected liquid to form on said exposed surfaces of said selected object, and allowing said film of said selected liquid to displace said rinse liquid on said exposed surfaces of said selected object.

9. The method of claim 2, further comprising the step of choosing said selected liquid from a group of substantially unreactive liquids consisting of isopropyl alcohol, ethyl alcohol, methyl alcohol, tetrahydrofuran, acetone, perfluorohexane, hexane and ether.

10. The method of claim 7, wherein said step of forming said aerosol droplets comprises the step of passing said selected liquid through a vibrating nozzle that vibrates at a selected frequency f lying in the range 10 kHz $\leq$f$\leq$1000 kHz.

11. The method of claim 10, further comprising said step of selecting said frequency f to lie in a range 20 kHz$\leq$f$\leq$100 kHz.

12. The method of claim 10, further comprising the step of selecting said frequency f so that at least one of said aerosol droplets has an estimated diameter d(sel) that lies in the range 10 μm$\leq$d(sel)$\leq$50 μm.

* * * * *